(12) United States Patent
Janssen et al.

(10) Patent No.: US 10,268,128 B2
(45) Date of Patent: Apr. 23, 2019

(54) LITHOGRAPHIC APPARATUS

(71) Applicant: ASML Netherlands B.V., Veldhoven (NL)

(72) Inventors: Franciscus Johannes Joseph Janssen, Geldrop (NL); Johannes Paul Marie De La Rosette, Venlo (NL); Edwin Cornelis Kadijk, Eindhoven (NL); Nicolas Alban Lallemant, Veldhoven (NL); Jan Liefooghe, Knesselare (BE); Markus Rolf Werner Matthes, Cologne (DE); Marcel Johannus Elisabeth Hubertus Muitjens, Nuth (NL); Hubert Matthieu Richard Steijns, Veldhoven (NL); André Gillis Van De Velde, Veldhoven (NL); Marinus Aart Van Den Brink, Moergestel (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/742,168

(22) PCT Filed: Jun. 14, 2016

(86) PCT No.: PCT/EP2016/063621
§ 371 (c)(1),
(2) Date: Jan. 5, 2018

(87) PCT Pub. No.: WO2017/005463
PCT Pub. Date: Jan. 12, 2017

(65) Prior Publication Data
US 2018/0196361 A1 Jul. 12, 2018

(30) Foreign Application Priority Data

Jul. 8, 2015 (EP) .................................... 15175869

(51) Int. Cl.
*G03F 7/20* (2006.01)
*H01S 3/036* (2006.01)
(Continued)

(52) U.S. Cl.
CPC ............ *G03F 7/70891* (2013.01); *F28C 1/08* (2013.01); *G03F 7/708* (2013.01);
(Continued)

(58) Field of Classification Search
CPC .. G03F 7/70008–7/70041; G03F 7/708; G03F 7/70858; G03F 7/70891; F28C 1/08;
(Continued)

(56) References Cited

U.S. PATENT DOCUMENTS 4,280,105 A * 7/1981 Marcy ................... H01S 3/041
372/58
5,812,242 A 9/1998 Tokuda
(Continued)

FOREIGN PATENT DOCUMENTS

JP H04-236087 A 8/1992

OTHER PUBLICATIONS

International Search Report and Written Opinion of the International Searching Authority directed to related International Patent Application No. PCT/EP2016/063621, dated Sep. 20, 2016; 13 pages.
(Continued)

*Primary Examiner* — Colin W Kreutzer
(74) *Attorney, Agent, or Firm* — Sterne, Kessler, Goldstein & Fox P.L.L.C.

(57) ABSTRACT

A lithographic apparatus comprising an illumination system configured to condition a radiation beam, a support structure constructed to support a patterning device, the patterning device being capable of imparting the radiation beam with a pattern in its cross-section to form a patterned radiation
(Continued)

beam, a substrate table constructed to hold a substrate, and a projection system configured to project the patterned radiation beam onto the substrate, the lithographic apparatus being provided with a first cooling fluid circuit which is configured to cool components to a first temperature, and provided with a second cooling fluid circuit which is configured to cool components to a second temperature that is lower than the first temperature.

20 Claims, 4 Drawing Sheets

(51) Int. Cl.
    *H01S 3/04*     (2006.01)
    *H01S 3/041*     (2006.01)
    *H01S 3/23*     (2006.01)
    *H05G 2/00*     (2006.01)
    *F28C 1/08*     (2006.01)
    *H01S 3/038*     (2006.01)
    *H01S 3/223*     (2006.01)

(52) U.S. Cl.
    CPC ...... *G03F 7/70025* (2013.01); *G03F 7/70033* (2013.01); *G03F 7/70858* (2013.01); *H01S 3/036* (2013.01); *H01S 3/038* (2013.01); *H01S 3/041* (2013.01); *H01S 3/0407* (2013.01); *H01S 3/2308* (2013.01); *H05G 2/008* (2013.01); *H01S 3/2232* (2013.01)

(58) Field of Classification Search
    CPC ........ F25B 25/005; H01S 3/036; H01S 3/038; H01S 3/0407; H01S 3/041; H01S 3/2232; H01S 3/2308; H05G 2/008
    USPC ........................................ 62/335; 355/30, 67
    See application file for complete search history.

(56) References Cited

U.S. PATENT DOCUMENTS

| | | |
|---|---|---|
| 6,128,323 A | 10/2000 | Myers et al. |
| 6,359,678 B1 | 3/2002 | Ota |
| 2001/0001248 A1 | 5/2001 | Emoto |
| 2005/0219501 A1 | 10/2005 | Sato et al. |
| 2008/0036981 A1 | 2/2008 | Emoto |
| 2010/0195196 A1 | 8/2010 | Nowak et al. |
| 2010/0217444 A1 | 8/2010 | Watanabe et al. |
| 2011/0024401 A1 | 2/2011 | Wahl et al. |
| 2013/0100975 A1 | 4/2013 | Borstel |
| 2014/0102875 A1* | 4/2014 | De Dea ................ C23C 14/185 |
| | | 204/157.15 |
| 2015/0030043 A1 | 1/2015 | Bewer et al. |

OTHER PUBLICATIONS

International Preliminary Report on Patentability directed to related International Patent Application No. PCT/EP2016/063621, dated Jan. 9, 2018; 10 pages.

\* cited by examiner

LITHOGRAPHIC APPARATUS

CROSS-REFERENCE TO RELATED APPLICATIONS

This application claims priority of EP application 15175869.5, which was filed on Jul. 8, 2015 and which is incorporated herein in its entirety by reference.

FIELD

The present invention relates to a lithographic apparatus. The lithographic apparatus may form part of a lithographic system which also includes a radiation system. The present invention also relates to a laser amplifier which may form part of a radiation system.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

A semiconductor fabrication plant (usually referred to as a fab) where devices such as integrated circuits are manufactured typically comprises several lithographic apparatuses and associated radiation systems. The fab further includes other apparatuses which perform operations such as baking and etching of lithographic substrates. The fab will consume a substantial amount of power.

SUMMARY

It is an object to the present invention to address a problem associated with the prior art, whether disclosed herein or elsewhere.

According to a first aspect of the invention there is provided a lithographic apparatus comprising an illumination system configured to condition a radiation beam, a support structure constructed to support a patterning device, the patterning device being capable of imparting the radiation beam with a pattern in its cross-section to form a patterned radiation beam, a substrate table constructed to hold a substrate, and a projection system configured to project the patterned radiation beam onto the substrate, the lithographic apparatus being provided with a first cooling fluid circuit which is configured to cool components to a first temperature, and being provided with a second cooling fluid circuit which is configured to cool components to a second temperature that is lower than the first temperature.

Providing the lithographic apparatus with two cooling fluid circuits operating at different temperatures is advantageous because it allows heat to be removed from the lithographic apparatus more efficiently than would be the case if a single cooling fluid circuit were to be used.

The second cooling fluid circuit may be configured to cool components to a temperature which is less than 20° C.

The first cooling fluid circuit may be configured to cool components to a temperature which is around 35° C. or more.

The second cooling fluid circuit of the lithographic apparatus may be configured to cool components to a temperature which is more accurately controlled than the temperature of components cooled by the first cooling fluid circuit.

The components cooled by the second cooling fluid circuit may comprise one or more of the support structure, the substrate table, optical components of the projection system.

According to a second aspect of the invention there is provided a radiation system provided with a first cooling fluid circuit which is configured to cool components to a first temperature, and provided with a second cooling fluid circuit which is configured to cool components to a second temperature that is lower than the first temperature.

Providing the radiation system with two cooling fluid circuits operating at different temperatures is advantageous because it allows heat to be removed from the radiation system more efficiently than would be the case if a single cooling fluid circuit were to be used.

Components cooled by the first cooling fluid circuit may comprise first heat exchangers of a laser amplifier, and components cooled by the second cooling fluid circuit may comprise second heat exchangers of the laser amplifier.

The radiation system may be configured to generate EUV radiation.

According to a third aspect of the invention there is provided a lithographic system comprising the lithographic apparatus of the first aspect of the invention and the radiation system of the second aspect of the invention.

According to a fourth aspect of the invention there is provided a laser amplifier comprising a main conduit provided with electrodes configured to transfer energy to gas for amplification of a laser beam, the laser amplifier further comprising a gas recirculation system comprising gas conduits configured to deliver gas to the main conduit and remove gas from the main conduit; wherein at least one of the gas conduits is provided with two heat exchangers each heat exchanger being configured to cool the gas via transfer of heat to a cooling fluid which flows through that heat exchanger, a first heat exchanger being configured to provide initial cooling of the gas and a second heat exchanger being configured to provide further cooling of the gas; and wherein the first heat exchanger is configured such that the initial cooling reduces the temperature of the gas to a temperature which is around 35° C. or more and such that the cooling fluid leaves the first heat exchanger with a temperature which is around 35° C. or more.

Cooling the laser amplifier in this manner is advantageous because it allows heat to be removed from the lithographic apparatus more efficiently than would be the case if a single cooling fluid circuit were to be used.

Two heat exchangers configured according to the fourth aspect of the invention may be provided for each of a plurality of gas delivery conduits configured to deliver gas to the main conduit.

Two heat exchangers configured according to the fourth aspect of the invention may be provided for each of a plurality of gas removal conduits configured to remove gas from the main conduit.

The first heat exchanger and the second heat exchanger may each comprise a tube through which the cooling fluid flows.

The tube of at least one of the heat exchangers may be helical.

The cooling fluid may leave the first heat exchanger with a temperature which is at least 60° C.

According to a fifth aspect of the invention there is provided a lithographic fab comprising a a first cooling fluid circuit which is configured to provide cooling fluid at a first temperature and a second cooling fluid circuit which is configured to provide cooling fluid at a second temperature that is lower than the first temperature.

Providing the lithographic fab with two cooling fluid circuits operating at different temperatures is advantageous because it allows heat to be apparatuses in fab more efficiently than would be the case if a single cooling fluid circuit were to be used.

The first cooling fluid circuit may comprise a heat exchanger configured to remove heat from the cooling fluid by transferring that heat to ambient air.

The heat exchanger may comprise a cooling tower around which the cooling fluid is pumped.

The lithographic fab may further comprise a waste heat recovery system configured to recover waste heat from the cooling fluid of the first cooling fluid circuit.

The waste heat recovery system may include an electrical generator arranged to transform energy recovered from the cooling fluid into electricity.

The waste heat recovery system may be a closed loop system which uses a working fluid that is separated from the cooling fluid of the first cooling fluid circuit.

The second cooling fluid circuit may comprise a second cooling system which includes a heat pump.

The lithographic fab may further comprise a plurality of lithographic systems which each include a first cooling fluid circuit configured to receive cooling fluid from the first cooling fluid circuit of the fab, and each include a second cooling fluid circuit configured to receive cooling fluid from the second cooling fluid circuit of the fab.

According to a sixth aspect of the invention there is provided a system comprising the lithographic fab of the fifth aspect of the invention and further comprising a building heating system arranged to use the cooling fluid of the first cooling fluid circuit to heat one or more buildings.

This is advantageous because heating the buildings provides a net energy saving (compared with using a separate energy source to heat the buildings).

According to a seventh aspect of the invention there is provided a method of amplifying a laser beam comprising using electrodes to transfer energy to a gas to amplify the laser beam in a main conduit recirculating the gas into and out of the main conduit, cooling the circulating gas using two heat exchangers which transfer heat from the gas to cooling fluid, a first heat exchanger providing initial cooling of the gas and a second heat exchanger providing further cooling of the gas, wherein the initial cooling reduces the temperature of the gas to a temperature of around 35° C. or more and the cooling fluid leaves the first heat exchanger with a temperature of around 35° C. or more.

BRIEF DESCRIPTION OF THE DRAWINGS

Embodiments of the invention will now be described, by way of example only, with reference to the accompanying schematic drawings, in which.

DETAILED DESCRIPTION

Figure 1:
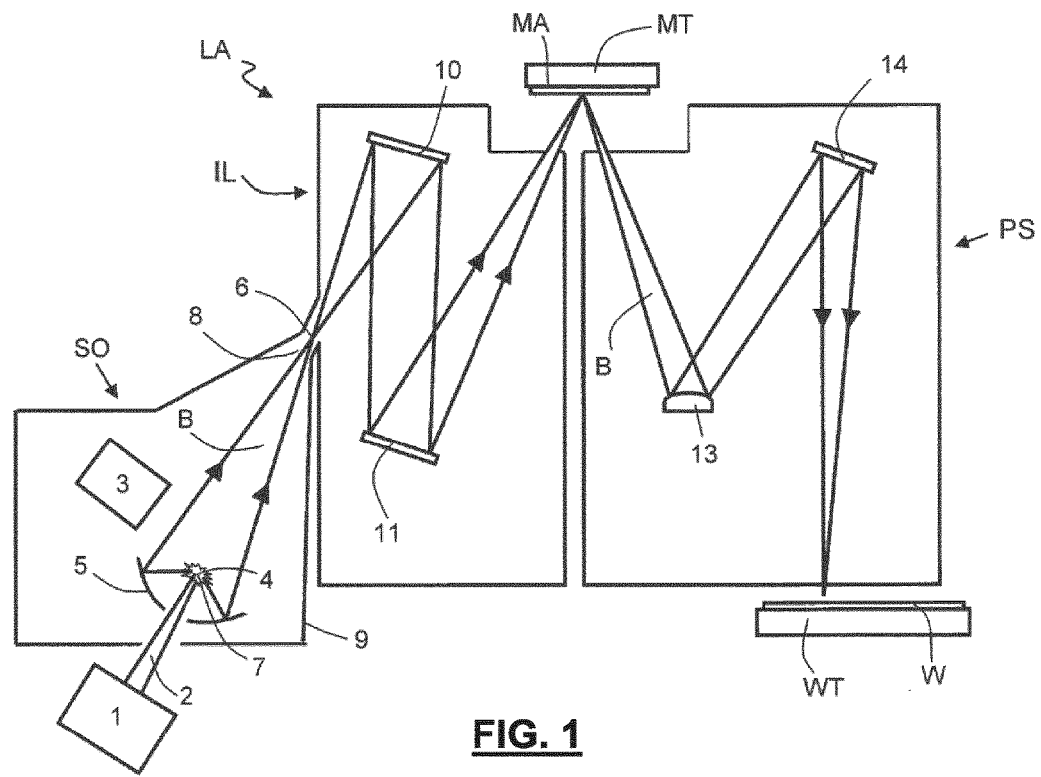
FIG. 1 depicts a lithographic system comprising a lithographic apparatus and a radiation system according to an embodiment of the invention.

FIG. 1 shows a lithographic system according to an embodiment of the invention. The lithographic system comprises a radiation source SO and a lithographic apparatus LA. The lithographic system comprises first and second cooling fluid circuits (not depicted) as described further below. The radiation source SO is configured to generate an extreme ultraviolet (EUV) radiation beam B. The lithographic apparatus LA comprises an illumination system IL, a support structure MT configured to support a patterning device MA (e.g. a mask), a projection system PS and a substrate table WT configured to support a substrate W. The illumination system IL is configured to condition the radiation beam B before it is incident upon the patterning device MA. The projection system is configured to project the radiation beam B (now patterned by the mask MA) onto the substrate W. The substrate W may include previously formed patterns. Where this is the case, the lithographic apparatus aligns the patterned radiation beam B with a pattern previously formed on the substrate W.

The radiation source SO, illumination system IL, and projection system PS may all be constructed and arranged such that they can be isolated from the external environment. A gas at a pressure below atmospheric pressure (e.g. hydrogen) may be provided in the radiation source SO. A vacuum may be provided in illumination system IL and/or the projection system PS. A small amount of gas (e.g. hydrogen) at a pressure well below atmospheric pressure may be provided in the illumination system IL and/or the projection system PS.

The radiation source SO shown in FIG. 1 is of a type which may be referred to as a laser produced plasma (LPP) source). A laser 1, which may for example be a $CO_2$ laser, is arranged to deposit energy via a laser beam 2 into a fuel, such as tin (Sn) which is provided from a fuel emitter 3. Although tin is referred to in the following description, any suitable fuel may be used. The fuel may for example be in liquid form, and may for example be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a plasma 7 at the plasma formation region 4. Radiation, including EUV radiation, is emitted from the plasma 7 during de-excitation and recombination of ions of the plasma.

The EUV radiation is collected and focused by a near normal incidence radiation collector 5 (sometimes referred to more generally as a normal incidence radiation collector). The collector 5 may have a multilayer structure which is arranged to reflect EUV radiation (e.g. EUV radiation having a desired wavelength such as 13.5 nm). The collector 5 may have an elliptical configuration, having two ellipse focal points. A first focal point may be at the plasma formation region 4, and a second focal point may be at an intermediate focus 6, as discussed below.

The laser 1 may be separated from the radiation source SO. Where this is the case, the laser beam 2 may be passed from the laser 1 to the radiation source SO with the aid of a beam delivery system (not shown) comprising, for example, suitable directing mirrors and/or a beam expander, and/or other optics. The laser 1 and the radiation source SO may together be considered to be a radiation system.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The radiation source SO is arranged such that the intermediate focus 6 is located at or near to an opening 8 in an enclosing structure 9 of the radiation source.

The radiation beam B passes from the radiation source SO into the illumination system IL, which is configured to condition the radiation beam. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular distribution. The radiation beam B passes from the illumination system IL and is incident upon the patterning device MA held by the support structure MT. The patterning device MA reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B enters the projection system PS. The projection system comprises a plurality of mirrors which are configured to project the radiation beam B onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors in FIG. 1, the projection system may include any number of mirrors (e.g. six mirrors).

Although the lithographic apparatus LA depicted in FIG. 1 is an EUV lithographic apparatus embodiments of the invention may comprise a DUV lithographic apparatus. Where this is the case the projection system may comprise transmissive optical components instead of mirrors (which are examples of reflective optical components).

Figure 2:
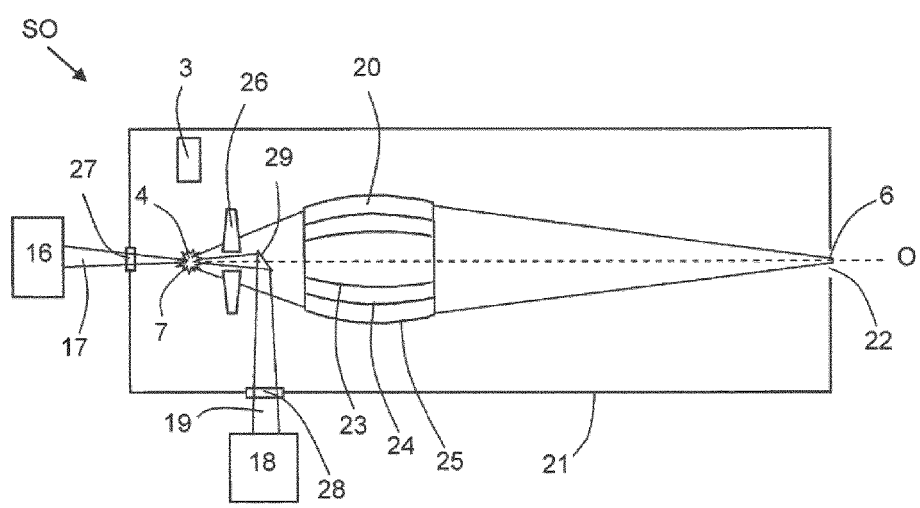
FIG. 2 depicts a radiation system according to an embodiment of the invention.

FIG. 2 shows a laser produced plasma (LPP) radiation source SO which has an alternative configuration to the radiation source shown in FIG. 1. The radiation source SO includes a fuel emitter 3 which is configured to deliver fuel to a plasma formation region 4. The fuel may for example be tin, although any suitable fuel may be used. A pre-pulse laser 16 emits a pre-pulse laser beam 17 which is incident upon the fuel. The pre-pulse laser beam 17 acts to preheat the fuel, thereby changing a property of the fuel such as its size and/or shape. A main laser 18 emits a main laser beam 19 which is incident upon the fuel after the pre-pulse laser beam 17. The main laser beam delivers energy to the fuel and thereby coverts the fuel into an EUV radiation emitting plasma 7. The pre-pulse laser 16 and the main laser 18 may be the same laser, the laser being configured to emit a pre-pulse and then emit a main pulse.

A radiation collector 20, which may be a so-called grazing incidence collector, is configured to collect the EUV radiation and focus the EUV radiation at a point 6 which may be referred to as the intermediate focus. Thus, an image of the radiation emitting plasma 7 is formed at the intermediate focus 6. An enclosure structure 21 of the radiation source SO includes an opening 22 which is at or near to the intermediate focus 6. The EUV radiation passes through the opening 22 to an illumination system of a lithographic apparatus (e.g. of the form shown schematically in FIG. 1).

The radiation collector 20 may be a nested collector, with a plurality of grazing incidence reflectors 23, 24 and 25 (e.g. as schematically depicted). The grazing incidence reflectors 23, 24 and 25 may be disposed axially symmetrically around an optical axis O. The illustrated radiation collector 20 is shown merely as an example, and other radiation collectors may be used.

A contamination trap 26 is located between the plasma formation region 4 and the radiation collector 20. The contamination trap 26 may for example be a rotating foil trap, or may be any other suitable form of contamination trap. In some embodiments the contamination trap 26 may be omitted.

An enclosure 21 of the radiation source SO includes a window 27 through which the pre-pulse laser beam 17 can pass to the plasma formation region 4, and a window 28 through which the main laser beam 19 can pass to the plasma formation region. A mirror 29 is used to direct the main laser beam 19 through an opening in the contamination trap 26 to the plasma formation region 4.

The radiation sources SO shown in FIGS. 1 and 2 may include components which are not illustrated. For example, a spectral filter may be provided in the radiation source. The spectral filter may be substantially transmissive for EUV radiation but substantially blocking for other wavelengths of radiation such as infrared radiation.

As mentioned further above, the laser 1 of the lithographic system depicted in FIG. 1 is arranged to deposit energy into a fuel such as tin. The amount of energy which is deposited into the fuel is substantial in order to convert the fuel into an EUV emitting plasma. Similarly, in the embodiment depicted in FIG. 2, the amount of energy delivered to the fuel by the main laser 18 is substantial in order to convert the fuel into an EUV radiation emitting plasma. In general, a laser beam used to convert fuel into an EUV radiation emitting plasma will require a substantial amount of energy.

A laser beam used to convert fuel into an EUV radiation emitting plasma may, for example, be generated using a $CO_2$ laser or other gas laser. In order to provide a laser beam with sufficient power to generate an EUV radiation emitting plasma, the laser may comprise an initial laser beam source and a plurality of laser amplifiers. Laser amplifiers may be arranged in series, each laser amplifier providing a further increase of the power of the laser beam.

Embodiments of the invention are described below in the context of a $CO_2$ laser amplifier, but the invention may be applied to other gas laser amplifiers. The gas in the $CO_2$ laser amplifier described below may for example comprise a mixture of $CO_2$, $N_2$ and He (as is conventional in a $CO_2$ laser). In the description below the gas is referred to as $CO_2$ gas for brevity.

An RF signal is applied to electrodes of a $CO_2$ gas laser amplifier and causes excitation of the $CO_2$ molecules. The $CO_2$ molecules move to an excited state thereby providing a population inversion. The laser beam passes through the excited $CO_2$ gas and is amplified by the $CO_2$ gas (i.e. the power of the laser beam is increased).

Although the energy provided to the $CO_2$ gas by the RF signal is used to amplify the laser beam, the efficiency with which energy is transferred from the $CO_2$ gas to the laser beam is less than 100% (it may for example be around 20%). As a result, a significant amount of the energy provided to the $CO_2$ gas is not transferred to the laser beam and instead causes heating of the gas. The efficiency of the laser amplification provided by the $CO_2$ gas reduces if the $CO_2$ gas is too hot. For this reason cooling of the $CO_2$ gas is provided. It may be desirable to cool the $CO_2$ gas to a temperature of around 30° C.

Figure 3:
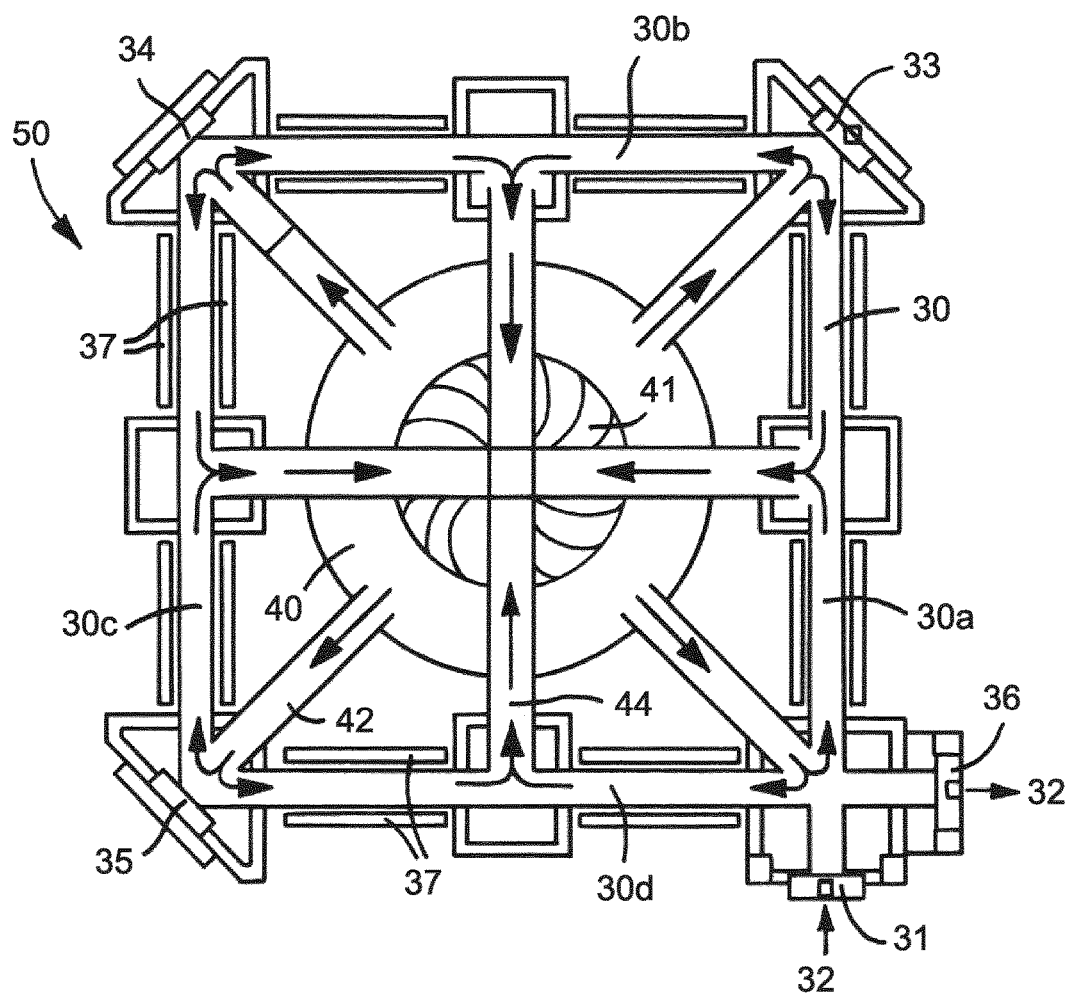
FIG. 3 depicts a laser amplifier according to an embodiment of the invention which forms part of the radiation system of FIG. 1 or FIG. 2.

A $CO_2$ gas laser amplifier according to an embodiment of the invention is depicted schematically in cross-section viewed from above in FIG. 3. The laser amplifier 50 comprises a main conduit 30 through which the laser beam passes and through which gas flows. The laser amplifier further comprises a gas recirculation system 40 which circulates the gas into and out of the main conduit 30. The gas recirculation system 40 includes a cooling system (depicted in FIG. 4 and described further below) which cools the gas in order to maintain the efficiency of the laser amplifier 50.

In more detail, the laser amplifier 50 comprises a first opening 31 through which an incident laser beam passes (the incident laser beam is depicted by arrow 32). The laser beam travels along a first arm 30a of the main conduit 30 and is incident upon a first mirror 33. The first mirror 33 is arranged at 45° to the laser beam to reflect the laser beam along a second arm 30b of the main conduit. A second mirror 34 is arranged at 45° to the laser beam, to reflect the laser beam along a third arm 30c of the main conduit 30. A third mirror 35 is also arranged at 45° and reflects the laser beam along a fourth and final arm 30d of the main conduit 30. The laser beam then passes out of an opening 36. As depicted, the four portions 30a-d of the main conduit 30 are arranged to form a square. The laser beam 32 enters and leaves the main conduit 30 from one corner of the square. Propagation of the laser beam 32 within the main conduit 30 is not illustrated in order to avoid over-complicating FIG. 3. Although the main conduit 30 is arranged as a square other configurations may be used.

Figure 4A:
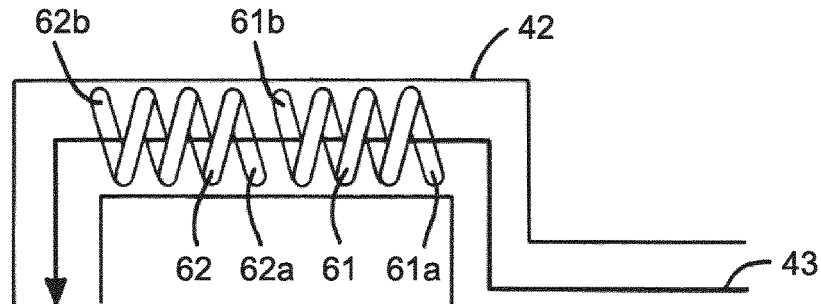
FIGS. 4a-4b depicts parts of the laser amplifier of FIG. 3 in more detail.

The gas recirculation system 40 comprises a fan 41 which is used to drive the $CO_2$ gas around gas recirculation paths. Portions of one gas recirculation path are depicted in cross-section viewed from one side in FIGS. 4A and 4B. FIG. 4A depicts a gas delivery conduit 42 which extends from the fan 41 to the main conduit 30 in the vicinity of the third mirror 35. The gas delivery conduit 42 steps upwards and includes a downwardly-extending final portion. This downwardly extending final portion delivers gas to the main conduit 30 in the vicinity of the third mirror 35 from above. The path of the gas is schematically indicated by arrow 43.

Figure 4B:
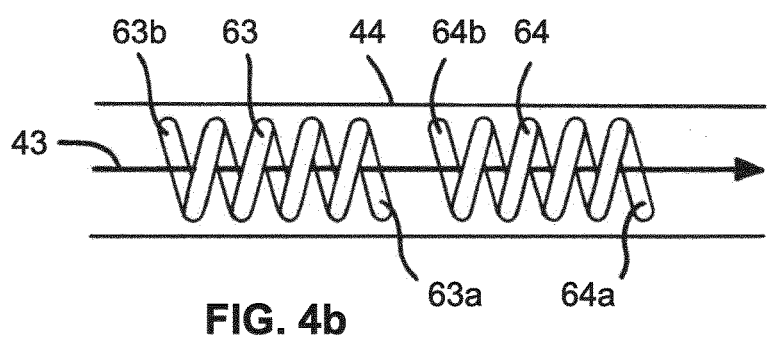

Referring to FIG. 3, gas which is delivered from the gas delivery conduit 42 in the vicinity of the third mirror 35, branches left and right and travels in two directions. Half of the gas travels along the third arm 30c of the main conduit 30 and half of the gas travels along the fourth arm 30d of the main conduit 30. The gas which travels along the fourth arm 30d enters a gas return conduit 44 which returns the gas to the fan 41. FIG. 4B schematically depicts the gas return conduit 44 in cross-section viewed from one side. The path of the gas is schematically indicated by arrow 43.

Although only one gas delivery conduit 42 and one gas return conduit 44 have been described, it will be appreciated that the laser amplifier 50 includes other gas delivery conduits and gas return conduits which are constructed in the same manner and operate in the same way. Four gas delivery conduits and four gas return conduits are depicted in FIG. 3. The direction of flow of the gas is schematically indicated by arrows (these are unlabelled in order to avoid over-complicating FIG. 3). Other numbers of gas delivery conduits and gas return conduits may be provided.

Electrodes are provided along each of the arms 30a-d of the main conduit 30, such as electrodes 37 along part of the third arm 30c. An RF signal is applied to the electrodes 37 and excites the $CO_2$ gas to provide a population inversion which amplifies the laser beam 32. Gas which has been used to amplify the laser beam travels out of the main conduit 30 and into one of the gas return conduits 44. The gas travels along the gas return conduit 44 to the fan 41. The fan 41 drives the gas along one of the gas delivery conduits 42 back into the main conduit 30 where it is again used to amplify the laser beam 32.

The gas is recirculated in order to facilitate cooling of the gas. As explained above, cooling of the gas is needed in order to avoid reduction of the efficiency of the laser amplifier 50. Cooling of the gas is provided by heat exchangers provided at the gas delivery conduits 42 and gas return conduits 44 as described below.

The gas delivery conduit 42 includes two heat exchangers 61, 62. The heat exchangers 61, 62 cool the $CO_2$ gas before it is delivered to the main conduit 30. The first heat exchanger 61 provides initial cooling of the $CO_2$ gas and the second heat exchanger 62 provides further cooling of the $CO_2$ gas. The gas may, for example, have a temperature of around 200° C., due primarily to energy being transferred to the gas from the fan 41. The first heat exchanger 61 may cool the gas to, for example, around 70° C. The second heat exchanger 62 may then further cool the gas, for example, to a temperature of around 30° C.

The gas return conduit 44 is also provided with a first heat exchanger 63 and a second heat exchanger 64. The first heat exchanger 63 provides initial cooling of the $CO_2$ gas and the second heat exchanger 64 provides further cooling of the $CO_2$ gas. As mentioned above, the gas is heated by the RF signal. This may heat the gas to, for example, a temperature of around 270° C. The first heat exchanger 63 of the gas return conduit 44 may cool the gas from around 270° C. to a temperature of around 70° C. The second heat exchanger 64 of the gas return conduit may further cool the gas to a temperature of around 30° C.

The heat exchangers 61-64 are schematically depicted in FIG. 4 as helixes through which the gas 43 flows. Each heat exchanger comprises a tube (e.g. formed from a metal such as stainless steel) through which a cooling fluid is pumped. Although the heat exchangers 61-64 are depicted as helixes they may have any suitable form. Each heat exchanger 61-64 includes an inlet 61a-64a through which cooling fluid is supplied to the heat exchanger, and includes an outlet 61b-64b from which cooling fluid is removed from the heat exchanger. Heat passes through walls of the heat exchangers 61-64 and is transferred to the cooling fluid. The cooling fluid transports the heat away from the laser amplifier 50. The cooling fluid may for example be water or may be some other fluid. Although embodiments of the invention are described in terms of water embodiments of the invention may use other fluids.

Figure 5:
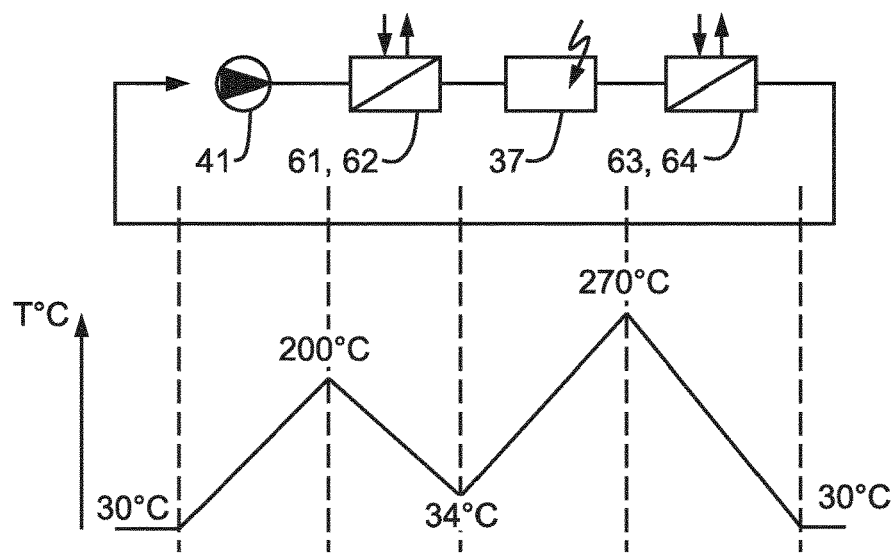
FIG. 5 is a graph which schematically depicts operation of an embodiment of the invention.

FIG. 5 is a graph which schematically depicts the temperature of the $CO_2$ gas in the laser amplifier 50. As depicted, the gas begins at a temperature of around 30° C., but is then heated to a temperature of around 200° C. as a result of the substantially adiabatic compression by the fan 41. The first and second heat exchangers 61, 62 of the gas delivery conduit 42 cool the gas to a temperature of around 34° C. The gas is then heated as a result of the excitation of the gas via the RF signal at the electrodes 37 and rises to a temperature of around 270° C. Finally, the first and second heat exchangers 63, 64 of the gas return conduit 44 cool the gas to a temperature of around 30° C.

Figure 6:
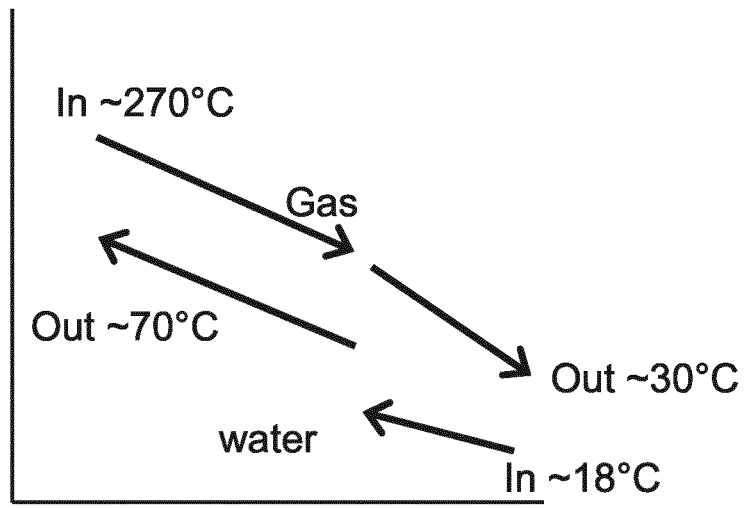
FIG. 6 is a graph which also schematically depicts operation of an embodiment of the invention.

FIG. 6 depicts the temperature of the gas in the gas return conduit 44 in more detail. At the start of the first heat exchanger 63 the gas has a temperature of around 270° C., and this temperature is reduced to around 70° C. by the first heat exchanger. The gas has a temperature of around 70° C. when it enters the second heat exchanger 64, and is cooled to around 30° C. when it leaves the second heat exchanger.

In addition to schematically depicting the temperature of the gas in the laser amplifier, FIG. 6 also schematically depicts the temperature of the water in the first and second heat exchangers 63, 64 of the gas return conduit 44. Water enters the first heat exchanger 63 at a temperature of around 35° C. and leaves the first heat exchanger at a temperature of around 70° C. Water enters the second heat exchanger 64 at a temperature of around 18° C. and leaves at a temperature of around 20-25° C.

Water which has been heated by the gas passes to cooling systems which are used to cool the water. A first cooling system forms part of a first cooling fluid circuit and cools water received from the first heat exchanger 63 of the gas return conduit. The first cooling system cools the water from around 70° C. to around 35° C. The first cooling fluid circuit delivers water at around 35° C. to the inlet 63a of the first heat exchanger 63. A second cooling system forms part of a second cooling fluid circuit. The second cooling system cools water received from the second heat exchanger 64 of the gas return conduit. The second cooling system cools the water from around 25° C. to around 18° C. The second cooling fluid circuit delivers water at around 18° C. to the inlet 64a of the second heat exchanger 64.

Cooling of heated water via transfer of heat to the ambient environment is possible if the temperature of the heated water is above the wet bulb temperature of the ambient environment (the wet bulb temperature depends upon the air temperature and the humidity of the air). In the following discussion, for simplicity only the temperature of the air is discussed. References to the ambient environment may be interpreted as being references to ambient air.

The temperature of the heated water received by the first cooling fluid circuit from the first heat exchanger 63 of the gas return conduit is well above an ambient air temperature in the vicinity of the fab. The ambient air temperature in the vicinity of the fab may be up to around 30° C., which is well below the temperature of the water (around 70° C.). Because the ambient air temperature is well below the temperature of the water, the water can be cooled using a cooling system which comprises a heat exchanger which is configured to transfer heat from the water to the ambient environment. The heat exchanger may be provided in a cooling tower which is open to the environment. Fans may be provided to push air over the heat exchanger in order to improve the transfer of heat to the environment. Water may be sprayed onto the heat exchangers in order to provide some cooling of the heat exchanger via evaporation. Using a heat exchanger which transfers heat to the ambient environment is advantageous because it requires a relatively small amount of energy. Some energy is needed to pump the water, power the fans and provide the water spray but energy is not being used to directly cool the water (i.e. to directly remove energy from the water). Transferring heat to the ambient environment is possible because the temperature of the water is significantly higher than the temperature of the ambient environment (if a significant temperature difference were not present then little or no heat transfer would occur). Transferring heat to the ambient environment may be considered to be passive cooling of the water.

Figure 7:
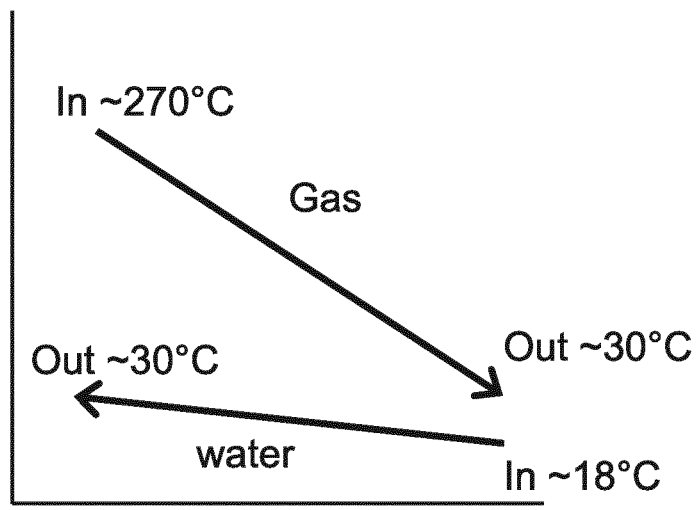
FIG. 7 is a graph useful for understanding a benefit provided by an embodiment of the invention.

The embodiment of the invention is advantageous compared with, for example, an arrangement in which the gas return conduit 44 were to be provided with a single heat exchanger rather than two heat exchangers. FIG. 7 depicts schematically the temperature of gas and temperature of the water in such an arrangement. As may be seen, the temperature of the gas is reduced from 270° C. to 30° C., and thus gas at the desired temperature is provided from the gas return conduit. However, the water used by the heat exchanger is heated only to 30° C. (it cannot have a higher temperature than this because the gas would also have a correspondingly higher temperature and this is not desirable). Thus, the water is input to the heat exchanger with a temperature of around 18° C. and leaves the heat exchanger with a temperature of around 30° C. Since the heated water only has a temperature of around 30° C. it cannot be cooled via heat exchange with the ambient environment because there is no significant temperature difference between the water and the ambient environment (it is assumed that the ambient environment could have a temperature of up to 30° C.).

Cooling the water to a temperature below the temperature of the ambient environment requires a heat pump (which may also be referred to a chiller). The heat pump uses a considerable amount of energy to remove heat from the water. Energy is used to actively remove heat from the water instead of the heat being transferred passively via heat exchange with the ambient environment. The heat pump transfers the energy to water in a secondary system, thereby heating that water to a temperature well above the ambient environment temperature. The water in the secondary system is then cooled using a heat exchanger (e.g. in a cooling tower) to the ambient environment. This two stage system uses considerably more energy than the simple system that may be used if water received from the laser amplifier 50 has a temperature well above the ambient environment temperature.

A further advantage provided by the embodiment of the invention is that water in the first cooling fluid circuit (e.g. water output from the first heat exchanger 63 of the gas return conduit) has a temperature which is sufficiently high that it can be used to power a waste heat recovery system. The waste heat recovery system may, for example, be used to power an electricity generator. The resulting electrical power may augment the power delivered to the laser amplifier 50 (thereby reducing the total power consumption of the laser amplifier). The electricity generator may comprise an expansion turbine which is driven by the heated water, the expansion turbine in turn driving a rotor of the electricity generator.

In an embodiment the waste heat recovery system may use the heated water as a working fluid. In an alternative arrangement, the waste heat recovery system may use a different working fluid in a closed loop. Where this is the case the heated water may be used to heat the working fluid via a heat exchanger. The closed loop waste heat recovery system may, for example, be an organic Rankine cycle system, a Stirling cycle system, or any other suitable system.

Additionally or alternatively, the heated water may be used to provide heating of buildings (e.g. buildings located in the vicinity of a fab in which the laser amplifier is provided). In an embodiment the buildings may be heated by a closed loop system which includes a heat exchanger that receives heat from the first cooling fluid circuit.

The temperature of the water in the heat exchangers 61, 62 of the gas delivery conduit 42 varies in a similar manner to that described above in connection with the heat exchangers 63, 64 of the gas return conduit 44. Thus, water from an outlet of the first heat exchanger 61 of the gas delivery conduit has a temperature well above the temperature of the ambient environment (e.g. a temperature of around 70° C.) and can be cooled via heat exchange with the ambient environment. Water from the first heat exchanger 61 can be used to power a waste heat recovery system. Water from the first heat exchanger 61 can be used to provide heating of buildings (e.g. buildings located in the vicinity of the fab in which the laser amplifier is provided).

As may be seen from FIG. 6, water in the second heat exchanger 64 of the gas return conduit has a temperature which increases from around 18° C. at the inlet 64*a* to a temperature of around 25° C. at the outlet 64*b*. The temperature of the water in the first heat exchanger 63 increases from around 30° C. to around 70° C. Thus, significantly less energy is absorbed by water in second heat exchanger 64 than is absorbed by water in the first heat exchanger 63. For example, 90% of the energy removed from the gas may be transferred to the water in the first heat exchanger 63 and 10% of the energy removed from the gas may be transferred to the water in the second heat exchanger 64. The water output from the second heat exchanger 64 is cooled using a heat pump (which may also be referred to a chiller). The heat pump uses energy to actively remove heat from the water. Although a significant amount of energy is required by the chiller to cool the water, less energy is required than would be needed if a single heat exchanger had been used to cool the gas. This is because a small proportion (e.g. 10%) of the energy taken from the gas is removed using the chiller whereas if a single heat exchanger had been used then all of the energy from the gas would need to be removed by the chiller.

Although the above example refers to particular water temperatures, these are merely examples and other water temperatures may be used. For example, the temperature of the water at the outlet 64*b* of the second heat exchanger 64 may be between 20° C. and 25° C.

In general, the temperature of the water at the outlets of the first and second heat exchangers 61-64 will depend in part upon the length of the heat exchangers and will depend in part upon the rate of flow of water through the heat exchangers. Increasing the length of a given heat exchanger will increase the temperature of water at the outlet of that heat exchanger (assuming that everything else remains constant). Decreasing the length of a given heat exchanger will reduce the temperature of water at the outlet of that heat exchanger (assuming that everything else remains constant). Increasing the rate of flow of water through the heat exchanger will reduce the temperature of water at the outlet of that heat exchanger (assuming that everything else remains constant). Decreasing the rate of flow of water through the heat exchanger will increase the temperature of water at the outlet of that heat exchanger (assuming that everything else remains constant). Thus, the heat exchangers may be designed to provide water with particular desired temperatures at their outlets.

The advantages provided by embodiments of the invention remain, irrespective of variation of the temperature of the water at the outlets of the heat exchangers. That is, only a portion of the heat taken from the gas must subsequently be removed by the chiller. The remainder of the heat taken from the gas can be removed using passive cooling (via heat exchange with the ambient environment). Thus, a significant energy saving is achieved. The proportion of heat which is actively removed from the water using a chiller may for example be less than 50%. Similarly, the proportion of heat which is passively removed from the water may be more than 50%.

For the reasons explained above, the total energy needed to cool the water when two heat exchangers are provided for a gas conduit is considerably less than the total energy that would be needed to cool the water if a single heat exchanger were to be provided for that gas conduit. When two heat exchangers are provided for each gas conduit of the laser amplifier 50 the total energy needed to cool the laser amplifier is considerably reduced (compared with the energy needed if each gas conduit were provided with a single heat exchanger). The energy efficiency of the laser amplifier and associated cooling system is increased significantly.

An energy saving will be provided if two heat exchangers are provided for some but not all of the gas conduits, although the energy saving will be reduced accordingly.

Although embodiments of the invention have been described in terms of two heat exchangers being provided for a gas conduit, more than two heat exchangers may be provided for a gas conduit.

The depicted heat exchangers may be described as being provided in series, in the sense that one heat exchanger cools the gas before the other heat exchanger cools the gas. In other words, the gas travels through one heat exchanger and then travels through the other heat exchanger. There may in some instances be an overlap between the end of one heat exchanger and the start of the next heat exchanger, but even where this is the case initial cooling of the gas is provided by the first heat exchanger and further cooling of the gas is provided by the next heat exchanger.

Although embodiments of the invention have been described in connection with a laser amplifier 50 with a particular configuration, embodiments of the invention may be used in connection with laser amplifiers with other configurations. Embodiments of the invention may be used in connection with $CO_2$ gas laser amplifiers or other gas laser amplifiers.

A semiconductor fabrication plant (usually referred to as a fab) typically comprises several lithographic apparatuses and associated radiation systems. Each radiation system comprises a plurality of laser amplifiers. Power used by the laser amplifiers accounts for a significant proportion of the power used by the fab. Around 20% of the energy used by a fab may be consumed cooling water used by the laser amplifiers. The energy saving achieved by providing heat exchangers in series as described above may be in the region of 5-15% of the energy consumption of a fab. Around an additional 10% energy saving may be achieved by including a waste heat recovery system in the fab as described above.

A cooling system used to cool water output from the first heat exchanger 61 of the gas delivery conduit may also be used to cool water output from the first heat exchanger 63 of the gas return conduit. The cooling system may form part of a first cooling fluid circuit of the fab which is configured to deliver water to heat exchangers at a temperature of around 35° C. (or some other higher temperature). The first cooling fluid circuit may be used to deliver water (or other fluid) to other components in the fab.

A cooling system used to cool water output from the second heat exchanger 62 of the gas delivery conduit may also be used to cool water output from the second heat exchanger 64 of the gas return conduit. The cooling system may form part of a second cooling fluid circuit of the fab which is configured to deliver water to heat exchangers at a temperature of around 18° C. (or some other temperature below 20° C.). The second cooling fluid circuit may be used to deliver water (or other fluid) to other components in the fab.

In general, a lithographic fab may be provided with a first cooling fluid circuit and a second cooling fluid circuit, the first and second cooling fluid circuits being configured to operate at different temperatures. For example, the first cooling fluid circuit may be configured to provide cooling fluid (e.g. water) at a temperature of around 35° C. and the second cooling fluid circuit may be configured to provide cooling fluid (e.g. water) at a temperature of around 18° C. The second cooling fluid circuit may control the temperature of the provided fluid more accurately than the first cooling fluid circuit. The first cooling fluid circuit may be configured to receive more heat than the second cooling fluid circuit. The cooling fluid circuits may be controlled by a controller.

The first and second cooling fluid circuits may be used to cool different parts of lithographic systems, a cooling fluid circuit being selected as appropriate for a given part of a lithographic system. For example, an EUV radiation source such as depicted in FIGS. 1 and 2 may include vanes which, during operation of the source, are at a temperature above the melting point of tin (e.g. above around 230° C.). The first cooling fluid circuit may be used to remove heat from the vanes (or from other fuel debris receiving surfaces of the EUV radiation source). The first cooling fluid circuit may deliver cooling fluid to the vanes (or other surfaces) at a temperature of around 35° C. A receptacle, which may be referred to as a tin catch, may be arranged to receive tin which is emitted from the fuel emitter 3 but is not vaporized by the laser beam 2, 19. The first cooling fluid circuit may be used to remove heat from the receptacle. In a further example, the first cooling fluid circuit may be used to remove heat from electronics of a lithographic apparatus (or other components of a lithographic apparatus). In a further example, the first cooling fluid circuit may be used to remove heat from a component of a mask inspection apparatus (e.g. a radiation source of the mask inspection apparatus). In general, the first cooling fluid circuit may be used to remove heat from a component which has a temperature above around 35° C. in use (e.g. which has a temperature above around 50° C. in use). The component may form part of a lithographic apparatus, may form part of a radiation system, may form part of a lithographic tool, or may form part of some other system in the lithographic fab. The component may be a first heat exchanger 61, 63 of a laser amplifier 50.

The first cooling fluid circuit of the lithographic fab may include a heat exchanger which allows the temperature of the cooling fluid delivered to lithographic system components to be selected. For example, an operator of the lithographic systems may configure the heat exchanger such that cooling fluid with a temperature of around 50° C. is provided rather than a temperature of around 35° C. The cooling fluid may be cooled to the selected temperature using fluid in a separate loop which exchanges heat with the ambient environment. Selecting a temperature of 50° C. instead of 35° C. will significantly increase the efficiency with which heat is transferred to the ambient environment. In general, selecting a higher temperature for the cooling fluid of the first cooling fluid circuit may allow the first cooling fluid circuit to be operated more efficiently. The first cooling fluid circuit may for example be configured to deliver fluid at a temperature of around 40° C. or more, at a temperature of around 50° C., or at a temperature of around 60° C. or more.

The second cooling fluid circuit may for example be used to cool parts of a lithographic apparatus. For example, referring to FIG. 1, the second cooling fluid circuit may be used to cool the support structure MT which supports the patterning device MA (e.g. a mask), and/or may be used to cool the substrate table WT. In a further example the second cooling fluid circuit may be used to cool mirrors 10, 11, 13, 14 of the lithographic apparatus. In a further example, the second cooling fluid circuit may be used to remove heat from a component of a mask inspection apparatus or a metrology apparatus (e.g. a substrate table of the mask inspection or metrology apparatus). In general, the second cooling fluid circuit may be used to remove heat from a component which has a temperature which is around 20° C. or less in use. For example the second cooling fluid circuit may be used to maintain a component at a temperature of around 18° C. (or a temperature within 1 or 2° C. of 18° C.). As mentioned above, the second cooling fluid circuit may control the temperature of the cooling fluid provided to components more accurately than the first cooling fluid circuit. The temperature of the cooling fluid provided to components may for example be controlled to within around 0.1° C. The component may be a second heat exchanger 62, 64 of a laser amplifier 50.

The second cooling fluid circuit may provide fluid with a more accurately controlled temperature than the first cooling fluid circuit but may capable of accommodating a lower load than the first cooling fluid circuit. In other words, the first cooling fluid circuit is capable of removing more heat from components in the fab than the second cooling fluid circuit, but delivers cooling fluid to those components at a less accurately controlled temperature. This arrangement of the first and second cooling fluid circuits is advantageous because it distinguishes between components which must have an accurately controlled temperature and components which must be cooled but do not require an accurately controlled temperature but which generate a higher heat load.

The first cooling fluid circuit may be cooled using a passive cooling system which transfers heat to the ambient environment (e.g. via heat exchangers in a cooling tower). The second cooling fluid circuit may be cooled using an active cooling system such as a heat pump (which may be referred to as a chiller).

In an embodiment, a lithographic apparatus may be provided with a first cooling fluid circuit which is configured to cool components to a first temperature, and may be provided with a second cooling fluid circuit which is configured to cool components to a second temperature that is lower than the first temperature. The first cooling fluid circuit may be configured to cool components to a temperature which is around 35° C. or more. The second cooling fluid circuit may be configured to cool components to a temperature which is less than 20° C. (e.g. around 18° C.). The second cooling fluid circuit of the lithographic apparatus may be configured to cool components to a temperature which is more accurately controlled than the temperature of components cooled by the first cooling fluid circuit. For example, referring to FIG. 1 the second cooling fluid circuit may be configured to cool the patterning device MA and the substrate W to a temperature which is less than 20° C., and the first cooling fluid circuit may be configured to cool other components such as electronics. The lithographic apparatus may be an EUV lithographic apparatus, as depicted in FIG. 1. Alternatively, the lithographic apparatus may be a DUV lithographic apparatus.

In an embodiment, a lithographic system which comprises a lithographic apparatus and a radiation system may be provided with a first cooling fluid circuit which is configured to cool components to a first temperature, and may be provided with a second cooling fluid circuit which is configured to cool components to a second temperature that is lower than the first temperature. The first cooling fluid circuit may be configured to cool components to a temperature which around 35° C. or more. The second cooling fluid circuit may be configured to cool components to a temperature which is less than 20° C. (e.g. around 18° C.). The second cooling fluid circuit of the lithographic system may be configured to cool components to a temperature which is more accurately controlled than the temperature of components cooled by the first cooling fluid circuit. For example, referring to FIG. 1 the second cooling fluid circuit may be configured to cool the patterning device MA and the substrate W to a temperature which is less than 20° C., and also to cool part of a laser amplifier which comprises the laser 1 (as described further above). The first cooling fluid circuit may for example be configured to cool an enclosing structure 9 of the radiation source SO, and may be configured to cool part of a laser amplifier which comprises the laser 1 (as described further above). The lithographic system may comprise an EUV radiation system, as depicted in FIG. 1. Alternatively, the lithographic system may comprise a DUV radiation system.

The first cooling fluid circuit of the lithographic apparatus (or lithographic system) may be connected to the first cooling fluid circuit of the fab. Similarly, the second cooling fluid circuit of the lithographic apparatus (or lithographic system) may be connected to the second cooling fluid circuit of the fab.

In an embodiment the fab may be provided with three or more cooling fluid circuits configured to deliver cooling fluid at different temperatures. The cooling fluid circuits may be configured to accommodate different heat loads.

In embodiments of the invention described above the water which leaves the first heat exchanger 61, 63 has a temperature of around 70° C. However, in other embodiments the water may have some other temperature. In general, the cooling fluid of the first cooling fluid circuit should be heated by components to a temperature of 35° C. or more. This is to allow cooling via exchange of heat to the ambient environment (it is assumed that the ambient environment may have a temperature of up to 30° C.). The temperature of the cooling fluid may for example be around 45° C. or more. In an embodiment, the cooling fluid output from a component has a temperature of around 45° C. or more, and the cooling fluid is cooled to a temperature of around 35° C. or less via exchange of heat to the ambient environment.

If the temperature of the cooling fluid is above around 60° C. then operation of a waste heat recovery system may be used. Similarly, heating of buildings may also be used.

The two-stage cooling approach described above in connection with a laser amplifier may be used for other components of a lithographic system or lithographic tool. For example, two-stage (or more) cooling of electronics (or other components) may be used.

Embodiments of the invention may be used in any apparatus in a lithographic fab. Embodiments of the invention may be used to cool part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although FIGS. 1 and 2 depict the radiation source SO as a laser produced plasma LPP source, any suitable source may be used to generate EUV radiation. For example, EUV emitting plasma may be produced by using an electrical discharge to convert fuel (e.g. tin) to a plasma state. A radiation source of this type may be referred to as a discharge produced plasma (DPP) source. The electrical discharge may be generated by a power supply which may form part of the radiation source or may be a separate entity that is connected via an electrical connection to the radiation source SO. The DPP source may include a laser amplifier according to an embodiment of the invention, the laser amplifier being used to assist in the generation of the plasma via the electric discharge. Components of the DPP source may for example be cooled using the second cooling fluid circuit.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A lithographic fab comprising:
   a lithographic apparatus configured to apply a pattern onto a substrate via electromagnetic radiation;
   a source configured to generate the electromagnetic radiation and comprising a laser amplifier configured to amplify a laser beam, the laser amplifier comprises a main conduit, a gas recirculation system, and first and second heat exchangers wherein:
   the main conduit comprises electrodes configured to transfer energy to a gas in the main conduit for amplification of the laser beam;
   the gas recirculation system comprises a gas conduit configured to deliver the gas to the main conduit or remove the gas from the main conduit;
   the first and second heat exchangers are in thermal contact with the gas;
   the first heat exchanger is configured to cool the gas, using a cooling fluid that is passively cooled, to a gas temperature between a high temperature at an input of the gas conduit and a low temperature at an output of the gas conduit;
   the second heat exchanger is configured to cool the gas, using a further cooling fluid, to the low temperature at the output of the gas conduit.

2. The lithographic fab of claim 1, further comprising a chiller configured to cool the further cooling fluid.

3. The lithographic fab of claim 1, wherein the cooling fluid and the further cooling fluid are substantially water.

4. A source for generating electromagnetic radiation, the source comprising:
a laser amplifier configured to amplify a laser beam and comprising a main conduit, a gas recirculation system, and first and second heat exchangers, wherein:
the main conduit is provided with electrodes configured to transfer energy to a gas in the main conduit for amplification of a laser beam;
the gas recirculation system includes a gas conduit configured to deliver the gas to the main conduit or remove the gas from the main conduit;
the first and second heat exchangers are configured to be in thermal contact with the gas conduit;
the first heat exchanger is configured cool the gas, using a cooling fluid that is passively cooled, to a gas temperature between a high temperature at an input of the gas conduit and a low temperature at an output of the gas conduit; and
the second heat exchanger is configured to use a further cooling fluid for cooling the gas to the low temperature at the output of the gas conduit.

5. The source of claim 4, wherein the cooling fluid and further cooling fluids are substantially water.

6. The lithographic fab of claim 1, wherein the cooling fluid exiting the first heat exchanger is substantially hotter than an ambient environment of the lithographic fab.

7. The lithographic fab of claim 1, wherein the further cooling fluid exiting the second heat exchanger is cooler than an ambient environment of the lithographic fab.

8. The lithographic fab of claim 1, further comprising a cooling system configured to remove heat from the cooling fluid.

9. The lithographic fab of claim 8, wherein the cooling system comprises a cooling tower configured to transfer the heat from the cooling fluid to an ambient environment of the lithographic fab.

10. The lithographic fab of claim 8, wherein the cooling system comprises a building heating system configured to use the heat from the cooling fluid to heat a building.

11. The lithographic fab of claim 8, wherein the cooling system comprises a waste heat recovery system configured to recover heat energy from the cooling fluid.

12. The lithographic fab of claim 11, wherein the waste heat recovery system comprises an electricity generator configured to generate electrical power using the heat energy.

13. The lithographic fab of claim 11, wherein the waste heat recovery system comprises a closed loop Rankine cycle system.

14. The lithographic fab of claim 11, wherein the waste heat recovery system comprises a closed loop Sterling cycle system.

15. The lithographic fab of claim 1, wherein:
the high temperature is approximately 270° C.;
the low temperature is approximately 30° C.; and
the gas temperature between the high temperature and the low temperature is approximately 70° C.

16. A method comprising:
amplifying a laser beam using a gas as an amplifying medium, wherein
the gas flows through a main conduit and
the amplifying comprises transferring energy to the gas in the main conduit using electrodes;
delivering the gas to the main conduit or removing the gas from the main conduit using a gas recirculation system;
cooling the gas to a gas temperature between a high temperature at an input of a gas conduit of the gas recirculation system and a low temperature at an output of the gas conduit using a cooling fluid and a first heat exchanger;
passively cooling the cooling fluid; and
cooling the gas to the low temperature at the output of the gas conduit using a further cooling fluid and the second heat exchanger.

17. The method of claim 16, further comprising transferring heat from the cooling fluid to an ambient environment using a cooling tower.

18. The method of claim 16, further comprising heating a building using a building heating system and heat from the cooling fluid.

19. The method of claim 16, further comprising:
recovering heat energy from the cooling fluid using a waste heat recovery system; and
generating electrical power using an electrical generator and the recovered heat energy.

20. The method of claim 16, wherein:
the high temperature is approximately 270° C.;
the low temperature is approximately 30° C.; and
the gas temperature between the high temperature and the low temperature is approximately 70° C.

\* \* \* \* \*